United States Patent
Kawabata et al.

(10) Patent No.: US 9,451,698 B2
(45) Date of Patent: Sep. 20, 2016

(54) PRINTED CIRCUIT BOARD AND POWER SUPPLY UNIT

(71) Applicants: Ryohei Kawabata, Tokyo (JP); Yuichiro Takarabe, Tokyo (JP)

(72) Inventors: Ryohei Kawabata, Tokyo (JP); Yuichiro Takarabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 10 days.

(21) Appl. No.: 14/428,008

(22) PCT Filed: Nov. 13, 2012

(86) PCT No.: PCT/JP2012/079328
§ 371 (c)(1),
(2) Date: Mar. 13, 2015

(87) PCT Pub. No.: WO2014/076746
PCT Pub. Date: May 22, 2014

(65) Prior Publication Data
US 2015/0271922 A1    Sep. 24, 2015

(51) Int. Cl.
H05K 1/00 (2006.01)
H05K 1/18 (2006.01)
H05K 3/34 (2006.01)
H05K 1/11 (2006.01)
H05K 1/02 (2006.01)

(52) U.S. Cl.
CPC ............... *H05K 1/18* (2013.01); *H05K 1/116* (2013.01); *H05K 3/3447* (2013.01); *H05K 1/0271* (2013.01); *H05K 2201/09063* (2013.01); *H05K 2201/10166* (2013.01); *H05K 2201/10409* (2013.01); *H05K 2201/10757* (2013.01); *H05K 2201/10969* (2013.01)

(58) Field of Classification Search
USPC ............. 361/748, 679.01, 720; 174/250, 261
See application file for complete search history.

(56) References Cited

U.S. PATENT DOCUMENTS

| | | | |
|---|---|---|---|
| 8,698,586 B2 * | 4/2014 | Park ...................... | H01F 27/325 336/192 |
| 2014/0029201 A1 * | 1/2014 | Yang ...................... | H01L 24/19 361/707 |

FOREIGN PATENT DOCUMENTS

JP    H02-125697 A    5/1990
(Continued)

OTHER PUBLICATIONS

International Search Report of the International Searching Authority mailed Jan. 15, 2013 for the corresponding international application No. PCT/JP2012/079328 (and English translation).

(Continued)

*Primary Examiner* — Andargie M Aychillhum
(74) *Attorney, Agent, or Firm* — Posz Law Group, PLC

(57) ABSTRACT

A printed circuit board mounted with a power module having both a plurality of lead terminals for soldering and at least one screw terminal for screwing includes a through hole which receives the lead terminal and is soldered to the lead terminal, and an electrode section provided with a screw hole fastened to the screw terminal via a screw. A groove is formed between the electrode section and the through hole so as to intersect with two common tangents each connecting, to an outer periphery of a land of the through hole, an outer periphery of a contact area of the electrode section which is in contact with a head bearing surface of a screw or a washer.

7 Claims, 3 Drawing Sheets

(56) References Cited

FOREIGN PATENT DOCUMENTS

| | | |
|---|---|---|
| JP | 2001-251029 A | 9/2001 |
| JP | 2002-026483 A | 1/2002 |
| JP | 2008-278566 A | 11/2008 |

OTHER PUBLICATIONS

Office Action mailed Aug. 4, 2015 in the corresponding JP application No. 2014-546746 (with English translation).
Extended European Search Report issued Jul. 19, 2016 in the corresponding EP patent application No. 12888525.8.

* cited by examiner

PRINTED CIRCUIT BOARD AND POWER SUPPLY UNIT

CROSS REFERENCE TO RELATED APPLICATION

This application is a U.S. national stage application of PCT/JP2012/079328 filed on Nov. 13, 2012, the contents of which are incorporated herein by reference.

TECHNICAL FIELD

The present invention relates to a printed circuit board and a power supply unit having a power module mounted on the printed circuit board and, more specifically, to a printed circuit board mounted with a power module having both a lead terminal and a screw terminal in a conduction area.

BACKGROUND ART

In general, when a power module is mounted on a printed circuit board, a lead terminal of the power module is inserted into a through hole formed in the printed circuit board, and is soldered to electrically connect the power module to the printed circuit board. However, since a large electric current flows through a terminal of, for example, a power supply in a large-capacity power module, a terminal for screwing which has a large area of contact with the printed circuit board is used instead of soldering the lead terminal. Further, even in a large-capacity power module, a lead terminal is used for a terminal of a signal wire or the like in which a small electric current flows. Accordingly, a lead terminal for soldering and a terminal for screwing are both disposed on one power module.

In mounting such a power module on the printed circuit board, when a terminal for screwing (to be referred to as a screw terminal hereinafter) is screwed after the lead terminal is soldered, a crack or the like may occur due to stress generated upon screwing and applied to the solder connection area of the lead terminal, thus lowering the connection reliability. Further, when the lead terminal is soldered after the screw terminal is screwed, the tightening force of the screw is decreased due to heat generated upon soldering, and retightening of the screw is necessary. Accordingly, since a screwing operation after soldering becomes necessary regardless of whether the lead terminal or the screw terminal is first mounted, there is a need to reduce stress acting on the soldering area upon screwing.

For example, Patent Literature 1 discloses a conventional technique for reducing stress acting on the soldering area. In Patent Literature 1, in the printed circuit board having a screw hole for fixing the power module, a slit for reducing the stress is formed around the screw hole.

CITATION LIST

Patent Literature

Patent Literature 1: Japanese Unexamined Patent Application Publication No. 2008-278566

SUMMARY OF INVENTION

Technical Problem

In Patent Literature 1, in order to fix the power module, a slit is formed around a hole formed on the printed circuit board to insert a screw. However, when the screw terminal of the power module is screwed, since pattern wiring is disposed around the screw hole, there is a problem that the slit cannot be formed or constraints in design for forming the slit is increased.

The present invention has been made in order to solve the above-mentioned problem, and has as its object to provide a printed circuit board in which when a power module which requires conduction by both a lead terminal and a screw terminal is mounted on the printed circuit board, stress does not act on a solder connection area, reliability can be ensured for a long period of time, and constraints in design can be reduced.

Solution to Problem

According to the present invention, a printed circuit board mounted with a power module having both a plurality of lead terminals to be subjected to soldering and at least one screw terminal for screwing includes a through hole which receives the lead terminal of the power module and is soldered to the lead terminal, and an electrode section provided at the power module and provided with a screw hole for fastening to the screw terminal via a screw. A groove is formed between the electrode section and the through hole so as to intersect with two common tangents each connecting an outer periphery of a contact area of the electrode section being in contact with one of a head bearing surface of the screw and a washer disposed between the head bearing surface and the electrode section.

Advantageous Effects of Invention

In the printed circuit board according to the present invention, since the groove is formed between the electrode section and the through hole so as to intersect with two common tangents each of which connects an outer periphery of a contact area of the electrode section being in contact with a head bearing surface of a screw or a washer and an outer periphery of a land of the through hole, stress generated upon screwing of the power module and applied to the solder connection area of the lead terminals can be decreased.

Accordingly, the present invention can provide the printed circuit board in which when the power module which requires conduction by both the lead terminals and the screw terminal is mounted on the printed circuit board, stress does not act on the solder connection area, reliability can be ensured for a long period of time, and constraints in design can be reduced.

DESCRIPTION OF EMBODIMENTS

Embodiments of a printed circuit board according to the present invention will be described below with reference to the accompanying drawings. All the drawings including FIG. 1 are schematically illustrated, and the sizes of components may have a relationship different from an actual one.

Embodiment 1

Figure 1:
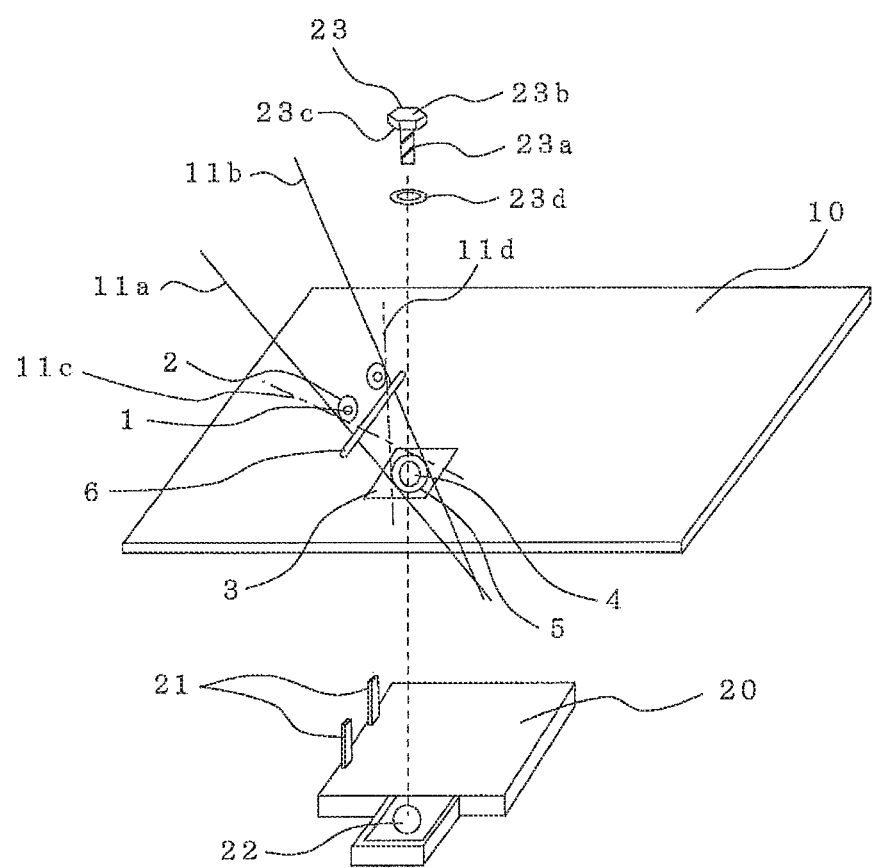
FIG. 1 is a schematic view of a printed circuit board according to Embodiment 1 of the present invention.

FIG. 1 is a schematic view of a printed circuit board 10 according to Embodiment 1 of the present invention.

The printed circuit board 10 has a wiring pattern made of conductive copper foil or the like (not shown in FIG. 1) printed on one or two surfaces of an insulated substrate having electric insulation property, and is used as a power supply unit when a power module 20 including an integrated circuit such as thyristor, power MOSFET and IGBT is mounted.

The power module 20 includes a plurality of lead terminals 21 and one or a plurality of screw terminals 22.

A plurality of through holes 1 and an electrode section 3 are formed on the printed circuit board 10. The plurality of through holes 1 are arrayed to receive the lead terminals 21 of the power module 20, and connect them to the printed circuit board 10 by soldering. The electrode section 3 has a through hole for fastening a screw 23 to the screw terminal 22 of the power module 20 to electrically connect them to each other. A peripheral surface defining the through hole 1 in the printed circuit board 10 is plated with copper or the like, and a land 2 for soldering is provided to the through hole 1. The land 2 is connected to a wiring pattern (not shown in FIG. 1) formed on the printed circuit board 10. The electrode section 3 is also connected to a wiring pattern (not shown in FIG. 1) formed on the printed circuit board 10.

The screw 23 has an external thread 23a and a screw head 23b. The external thread 23a of the screw 23 is inserted into a screw hole 4 formed in the electrode section 3 as a through hole, and is fastened to an internal thread (not shown in FIG. 1) formed on the screw terminal 22 of the power module 20. A head bearing surface 23c under the neck of the screw head 23b, or a washer 23d (the washer may not be provided) disposed between the head bearing surface 23c and the electrode section 3 is in contact with a contact area 5 formed around the screw hole 4, and accordingly, the electrode section 3 of the printed circuit board 10 and the screw terminal 22 of the power module 20 are electrically connected to each other via the screw 23.

Further, the lead terminals 21 of the power module 20 and the through holes 1 in the printed circuit board 10 are electrically connected to each other by soldering the lands 2 of the through holes 1 and projections of the lead terminals 21 projecting from the through holes 1 after the lead terminals 21 are inserted into the through holes 1.

When the screw 23 is fastened to the screw terminal 22 of the power module 20, the printed circuit board 10 flexes by the fastening force. Stress acting upon this flexural deformation causes a problem such as a crack in a solder connection area of the lead terminals 21 of the power module 20.

Accordingly, in order to prevent such a problem, a groove 6 is formed in the printed circuit board 10, as shown in FIG. 1, so as to decrease stress acting on the solder connection area of the lead terminals 21.

The groove 6 serves as a barrier which blocks deformation and stress radially transmitted from a fixation area of the screw 23 to the solder connection area of the lead terminals 21. For this reason, the groove 6 is formed so as to intersect with (or separate) two common tangents 11 each connecting the outer periphery of the contact area 5 around the screw hole 4 of the electrode section 3 to the outer periphery of the land 2 of the corresponding through hole 1. The two common tangents 11 may not cross each other with respect to the land 2 of the through hole 1 as indicated by the solid line in FIG. 1 (11a, 11b), or alternatively, the two common tangents 11 may cross each other as indicated by the dotted line (11c, 11d). The two common tangents 11 which do not cross each other will be referred to as "non-crossing type common tangents" hereinafter, while the two common tangents 11 which cross each other will be referred to as "crossing type common tangents" hereinafter.

The groove 6 is formed so as to intersect with the non-crossing type common tangents 11a and 11b or the crossing type common tangents 11c and 11d. The groove 6 may be formed at any position between the contact area 5 of the electrode section 3 and the land 2 of the through hole 1. However, the length and shape of the groove 6 may vary depending on the position of the groove 6 or the position of the wiring pattern.

The groove 6 need only serve to reduce stress generated by the lead terminals 21 of the power module 20 and applied to the solder connection area. Accordingly, the groove 6 is formed to have a certain depth (for example, a depth of about a half of the thickness of the printed circuit board 10) or extend through the printed circuit board 10 such as a slit. The depth of the groove 6 preferably varies depending on the position of the groove 6 so as to be larger in the vicinity of the electrode section 3 and smaller in the vicinity of the through hole 1. Further, the width of the groove 6 is sufficient with 1 mm or more.

The through holes 1 are arranged in correspondence with the number, pitch and cross-sectional shape of lead terminals 21 of the power module 20. Although only two through holes 1 are shown in FIG. 1, three or more through holes 1 may be provided. For example, in FIG. 1, assuming that one or more through holes are arranged between two through holes 1, the groove 6 is formed so as to intersect with two common tangents (non-crossing type common tangents or crossing type common tangents) 11 which are provided to the lands 2 of two through holes 1 at two ends of the array of through holes.

Further, although one screw terminal 22 of the power module 20 is shown in FIG. 1, in the case where, for example, two screw terminals 22 are provided, another groove having a configuration similar to the above-mentioned one may be provided to the other screw terminal 22. That is, the groove is formed so as to intersect with two common tangents (non-crossing type common tangents or crossing type common tangents) 11 which are provided to the lands 2 of two through holes 1 at two ends of the array of through holes. In this case, the groove is formed by curving or bending the groove 6 shown in FIG. 1 so as to surround the array of through holes or extending the length of the groove 6. Alternatively, two separate grooves 6 are provided.

As described above, in Embodiment 1, the groove 6 is formed so as to intersect with two common tangents 11 each connecting the outer periphery of the contact area 5 of the electrode section 3 which is in contact with the head bearing surface 23c of the screw 23 or the washer to the outer periphery of the land 2 of the corresponding through hole 1. When the power module 20 is mounted on the printed circuit board 10 by the screw 23, stress acting upon screwing is reduced by the groove 6 so as not to be applied to the solder connection area of the lead terminals 21 of the power module 20. Accordingly, the connection reliability of the lead terminals 21 of the power module 20 can be maintained for a long period of time. Since one groove 6 is provided to the array of through holes 1, stress acting on the solder connection area of the array of lead terminals 21 can be reduced by one groove 6. Further, since the groove 6 can be formed in an area other than the wiring pattern on the printed circuit board 10, constraints in design can be reduced.

Embodiment 2

Figure 2:
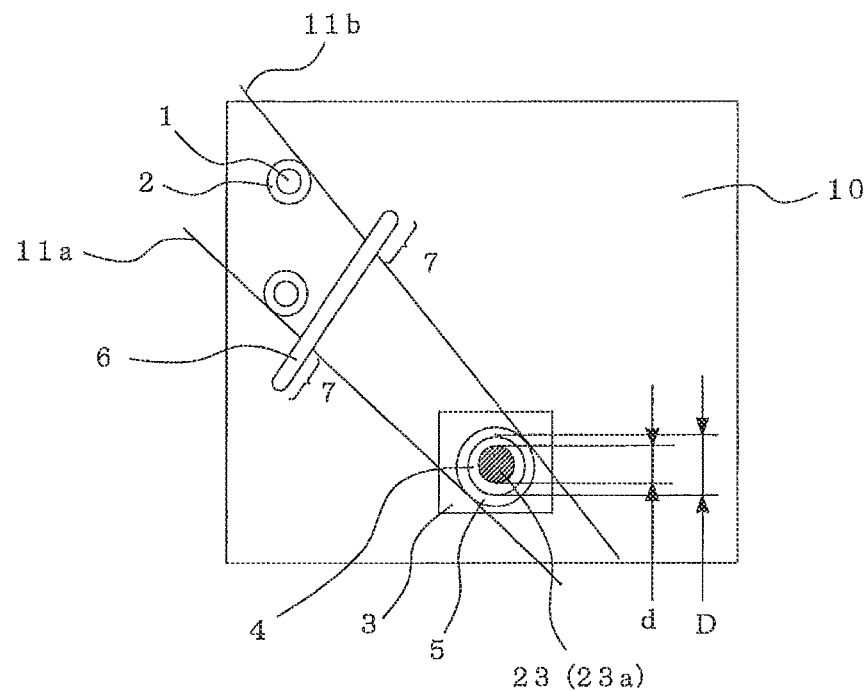
FIG. 2 is a schematic view of a printed circuit board according to Embodiment 2 of the present invention.

FIG. 2 is a schematic view of the printed circuit board 10 according to Embodiment 2 of the present invention.

In Embodiment 1, two ends of the groove 6 extend from respective common tangents 11. This prevents stress from concentrating on the solder connection area of the lead terminals 21 of the power module 20 in screwing of the power module 20.

Embodiment 2 defines an amount of extension 7 of the groove 6. That is, the screw hole 4 in the electrode section 3 of the printed circuit board 10 generally has a diameter larger than that of the screw 23, and the contact area of the printed circuit board 10 and the screw 23 is displaced by an amount corresponding to the clearance between the screw 23 and the screw hole 4.

Accordingly, letting D be the inner diameter of the screw hole 4, and d be the outer diameter of the screw 23 (the outer diameter of the external thread 23*a*), the groove 6 is formed so as to extend from each common tangent 11 by an amount corresponding to the clearance (D-d) between the screw 23 and the screw hole 4. The amount of extension 7 of the groove 6 need only be equal to or larger than the clearance (D-d).

Other configurations are the same as in Embodiment 1, and operational advantages are also the same as in Embodiment 1.

Embodiment 3

Figure 3:
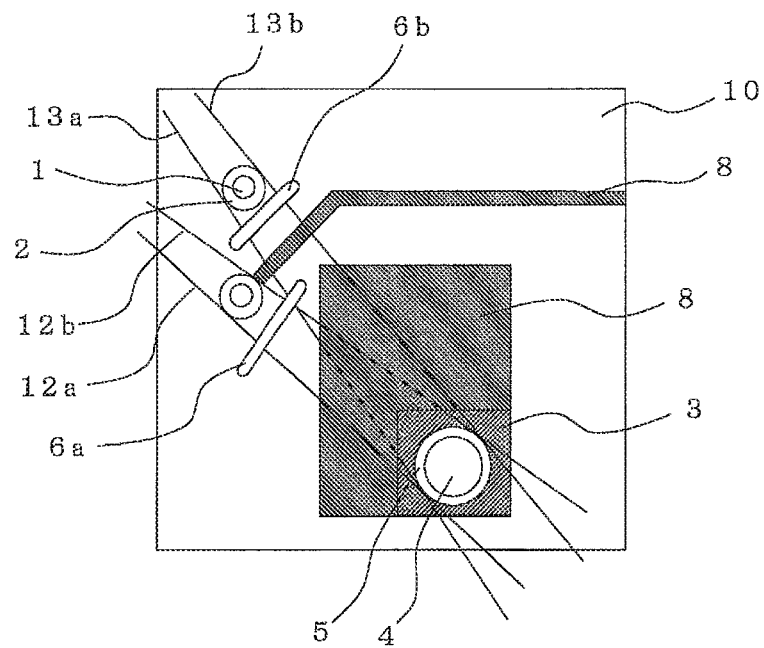
FIG. 3 is a schematic view of a printed circuit board according to Embodiment 3 of the present invention.

FIG. 3 is a schematic view of the printed circuit board 10 according to Embodiment 3 of the present invention.

Embodiments are not limited to a single groove 6. In the case where the groove 6 cannot be provided due to factors associated with the wiring pattern 8 located in the surrounding area, grooves 6*a* and 6*b* are individually provided to the through holes 1, as shown in FIG. 3. In this case as well, the groove 6*a* is provided so as to intersect with two common tangents (non-crossing type common tangents or crossing type common tangents) 12*a* and 12*b*, while the groove 6*b* is formed so as to intersect with two common tangents (non-crossing type common tangents or crossing type common tangents) 13*a* and 13*b*.

In Embodiment 3, since the grooves 6*a* and 6*b* are individually provided to the through holes 1, stress acting on the solder connection area of the individual lead terminals 21 can be reduced. Further, since the grooves 6*a* and 6*b* can be provided in an area other than the wiring pattern 8, design freedom can be provided.

Embodiment 4

Figure 4:
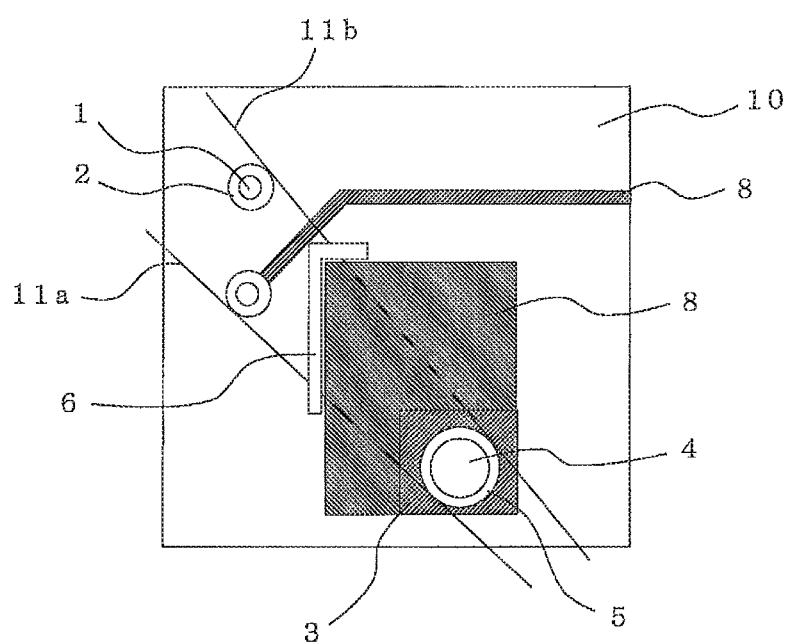
FIG. 4 is a schematic view of a printed circuit board according to Embodiment 4 of the present invention.

FIG. 4 is a schematic view of the printed circuit board 10 according to Embodiment 4 of the present invention.

The groove 6 (6*a*, 6*b*) is not limited to a linear groove, and may be provided in accordance with the shape of the wiring pattern 8. In this example, the groove 6 is formed in an L-shape, as shown in FIG. 4. Other configurations are the same as in Embodiment 1.

Also in Embodiment 4, since one L-shaped groove 6 is provided to the array of through holes 1, stress acting on the solder connection area of the array of lead terminals 21 can be reduced by one groove 6. Accordingly, the connection reliability of the lead terminals 21 of the power module 20 can be maintained for a long period of time, and constraints in design can be reduced.

Although Embodiments 1 to 4 have been described above as having one screw terminal section in the power module 20, the same applies to the case where a plurality of screw terminal sections are provided in one power module 20.

Further, although one power module 20 is mounted on one printed circuit board 10 in the above cases, this invention is also applicable to examples in which a plurality of power modules 20 are mounted on one printed circuit board 10.

In addition, this invention is also applicable to a printed circuit board having no screw terminal section and configured so that a power module is fixed simply by screwing, as described in Patent Literature 1.

Accordingly, a power supply unit (not shown) provided with the printed circuit board 10 shown in Embodiments 1 to 4 can provide a highly reliable power supply unit.

REFERENCE SIGNS LIST

1 through hole 2 land 3 electrode section 4 screw hole 5 contact area 6 groove 6*a*, 6*b* groove 7 amount of extension 8 wiring pattern 9, 10 printed circuit board 11 common tangent 11*a*, 11*b* non-crossing type common tangent 11*c*, 11*d* crossing type common tangent 12*a*, 12*b* common tangent 13*a*, 13*b* common tangent 20 power module 21 lead terminal 22 screw terminal

23 screw 23*a* external thread 23*b* screw head 23*c* head bearing surface 23*d* washer

The invention claimed is:

1. A printed circuit board mounted with a power module having both a plurality of lead terminals to be subjected to soldering and at least one screw terminal for screwing, comprising:
    a plurality of through holes arranged in an array, each of the through holes having a land for soldering, receiving each lead terminal of the power module, and being soldered to the lead terminal;
    an electrode section provided with a screw hole for fastening to the screw terminal of the power module via a screw, and
    a groove formed between the electrode section and the through holes so as to intersect with two common tangents, each of the two common tangents connecting corresponding one of outer peripheries of two of the lands respectively disposed at both ends of the array of the plurality of through holes with an outer periphery of a contact area of the electrode section being in contact with one of a head bearing surface of the screw and a washer disposed between the head bearing surface and the electrode section.

2. The printed circuit board of claim 1, wherein
    the groove is formed so as to intersect with the two common tangents defined for the through holes located at both ends of the array of through holes.

3. The printed circuit board of claim 1, wherein
    the groove is formed so as to intersect with the two common tangents defined for each through hole.

4. The printed circuit board of claim 1, wherein both ends of the groove extend from the corresponding common tangents.

5. The printed circuit board of claim 4, wherein an amount of extension of the groove extending from the corresponding common tangents is not less than a clearance which is a difference between an inner diameter of the screw hole in the electrode section and an external diameter of the screw.

6. The printed circuit board of claim 1, wherein the groove has a width of not less than 1 mm.

7. A power supply unit including a printed circuit board mounted with a power module having both a plurality of lead terminals to be subjected to soldering and at least one screw terminal for screwing, the printed circuit board comprising:
- a plurality of through holes arranged in an array, each of the through holes having a land for soldering, receiving each lead terminal of the power module, and being soldered to the lead terminal;
- an electrode section provided with a screw hole for fastening to the screw terminal of the power module via a screw; and
- a groove formed between the electrode section and the through holes so as to intersect with two common tangents, each of the two common tangents connecting corresponding one of outer peripheries of two of the lands respectively disposed at both ends of the array of the plurality of through holes with an outer periphery of a contact area of the electrode section being in contact with one of a head bearing surface of the screw and a washer disposed between the head bearing surface and the electrode section.

* * * * *